(12) United States Patent
Yu

(10) Patent No.: US 6,372,659 B1
(45) Date of Patent: Apr. 16, 2002

(54) FABRICATION OF METAL OXIDE STRUCTURE FOR A GATE DIELECTRIC OF A FIELD EFFECT TRANSISTOR

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 48 days.

(21) Appl. No.: 09/661,041

(22) Filed: Sep. 14, 2000

(51) Int. Cl.[7] ........................ H01L 21/31; H01L 21/469
(52) U.S. Cl. ........................................ 438/766; 438/785
(58) Field of Search ............................... 438/765–768, 438/770–774, 785, 216–230, 240, 243, 253, 289, 386–396

(56) References Cited

U.S. PATENT DOCUMENTS 6,297,107 B1 * 10/2001 Paton et al. ................. 438/291
6,300,203 B1 * 10/2001 Buynoski et al. ............ 438/287
6,329,697 B1 * 12/2001 Shin ............................ 257/501

* cited by examiner

Primary Examiner—Matthew Smith
Assistant Examiner—Calvin Lee
(74) Attorney, Agent, or Firm—Monica H. Choi

(57) ABSTRACT

For fabricating a metal oxide structure on a semiconductor substrate, an active device area is formed to be surrounded by at least one STI (shallow trench isolation) structure in the semiconductor substrate. A layer of metal is deposited on the semiconductor substrate, and the layer of metal contacts the active device area of the semiconductor substrate. A layer of oxygen blocking material is deposited on the layer of metal, and an opening is etched through the layer of oxygen blocking material to expose an area of the layer of metal on top of the active device area. An interfacial dopant is implanted through the layer of metal to the semiconductor substrate adjacent the layer of metal in the area of the opening where the layer of metal is exposed. A thermal oxidation process is performed to form a metal oxide structure from reaction of oxygen with the area of the opening where the layer of metal is exposed. A thickness of the metal oxide structure is determined by a thickness of the layer of metal, and the layer of oxygen blocking material prevents contact of oxygen with the layer of metal such that the metal oxide structure is formed localized at the area of the opening where the layer of metal is exposed. The interfacial dopant implanted in to the semiconductor substrate adjacent the layer of metal promotes adhesion of the metal oxide structure to the semiconductor substrate. In this manner, the metal oxide structure is formed by localized thermal oxidation of the layer of metal such that a deposition or sputtering process or an etching process is not necessary for formation of the metal oxide structure. In addition, the thickness of the metal oxide structure is determined by controlling the thickness of the layer of metal used for forming the metal oxide structure.

13 Claims, 4 Drawing Sheets

FABRICATION OF METAL OXIDE STRUCTURE FOR A GATE DIELECTRIC OF A FIELD EFFECT TRANSISTOR

TECHNICAL FIELD

The present invention relates generally to fabrication of field effect transistors having scaled-down dimensions, and more particularly, to fabrication of a field effect transistor with a gate dielectric of metal oxide for relatively high thickness of the gate dielectric to minimize tunneling current through the gate dielectric.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride (SiN), then a spacer liner oxide 124 is deposited as a buffer layer between the spacer 122 and the sidewalls of the gate electrode 118 and the gate dielectric 116.

Conventionally, the gate dielectric 116 for the MOSFET 100 is typically comprised of silicon dioxide ($SiO_2$), and the gate electrode 118 is typically comprised of polysilicon. As the channel length and width dimensions of the MOSFET 100 are scaled down for enhanced speed performance, the thicknesses of the gate dielectric 116 and the gate electrode 118 are also correspondingly scaled down, as known to one of ordinary skill in the art of integrated circuit fabrication. However, as the channel length and width dimensions of the MOSFET 100 are scaled down to tens of nanometers, the thickness of the gate dielectric 116 is also scaled down to tens of angstroms when the gate dielectric 116 is comprised of silicon dioxide ($SiO_2$). With such a thin gate dielectric 116, charge carriers easily tunnel through the gate dielectric 116, as known to one of ordinary skill in the art of integrated circuit fabrication.

When charge carriers tunnel through the gate dielectric 116, gate leakage current undesirably increases resulting in increased static power dissipation and even circuit malfunction. In addition, with charge carriers tunneling through the gate dielectric 116, decreased charge carrier accumulation in the channel of the MOSFET may result in undesirable increase in resistance through the channel of the MOSFET. Furthermore, with the thin gate dielectric 116, the charge accumulation at the gate electrode 118 causes an undesirable increase in charge carrier scattering at the surface of the channel of the MOSFET 100. Such increase in charge carrier scattering in turn results in higher resistance through the channel of the MOSFET.

In light of these disadvantages of the thin gate dielectric 116 when the gate dielectric 116 is comprised of silicon dioxide ($SiO_2$), a gate dielectric having a dielectric constant that is higher than the dielectric constant of silicon dioxide ($SiO_2$) (i.e., a high dielectric constant material) is used for a field effect transistor having scaled down dimensions of tens of nanometers. A dielectric material having a higher dielectric constant has higher thickness for achieving the same capacitance. Thus, when the gate dielectric is comprised of a high dielectric constant material, the gate dielectric has a higher thickness (hundreds of angstroms) than when the gate dielectric is comprised of silicon dioxide ($SiO_2$) (tens of angstroms), for field effect transistors having scaled down dimensions of tens of nanometers.

The gate dielectric with high dielectric constant has higher thickness to minimize charge carrier tunneling through the gate dielectric for field effect transistors having scaled down dimensions of tens of nanometers. Charge carrier tunneling through the gate dielectric is minimized exponentially by the thickness of the gate dielectric. Examples of dielectric materials with high dielectric constant include metal oxides such as aluminum oxide ($Al_2O_3$), titanium dioxide ($TiO_2$), tantalum oxide ($Ta_2O_5$), or zirconium dioxide ($ZrO_2$).

Such dielectric material are usually deposited or sputtered onto the semiconductor substrate in the prior art. However, with the deposition and sputtering processes of the prior art, the uniformity of thickness of such dielectric material for formation of gate dielectrics having scaled down dimensions of hundreds of angstroms is typically unacceptable. In addition, the metal oxide is typically difficult to etch. For example, in a wet etch process, metal residue from the etched metal oxide may undesirably contaminate the semiconductor substrate. Furthermore, a metal oxide structure having high quality interfacial adhesion to the channel region of the MOSFET of the semiconductor substrate is desired.

Thus, a mechanism is desired for effectively fabricating a metal oxide structure having relatively high thickness on the semiconductor substrate for use as a gate dielectric of a field effect transistor having scaled down dimensions of tens of nanometers to minimize charge carrier tunneling through the gate dielectric.

SUMMARY OF THE INVENTION

Accordingly, in a general aspect of the present invention, a metal oxide structure is fabricated by forming an opening on top of a layer of metal and with localized thermal oxidation of the layer of metal exposed at the opening. In addition, a dopant, such as nitrogen ions are implanted into the semiconductor substrate near the layer of metal before formation of the metal oxide structure to promote strong interfacial adhesion of the metal oxide structure to the semiconductor substrate.

In one embodiment of the present invention, in a method for fabricating a metal oxide structure on a semiconductor substrate, an active device area is formed to be surrounded by at least one STI (shallow trench isolation) structure in the semiconductor substrate. A layer of metal is deposited on the semiconductor substrate, and the layer of metal contacts the active device area of the semiconductor substrate. A layer of oxygen blocking material is deposited on the layer of metal, and an opening is etched through the layer of oxygen blocking material to expose an area of the layer of metal on top of the active device area. An interfacial dopant is implanted through the layer of metal to the semiconductor substrate adjacent the layer of metal in the area of the opening where the layer of metal is exposed.

A thermal oxidation process is performed to form a metal oxide structure from reaction of oxygen with the area of the opening where the layer of metal is exposed. A thickness of the metal oxide structure is determined by a thickness of the layer of metal, and the layer of oxygen blocking material prevents contact of oxygen with the layer of metal such that the metal oxide structure is formed localized at the area of the opening where the layer of metal is exposed. The interfacial dopant implanted into the semiconductor substrate adjacent the layer of metal promotes adhesion of the metal oxide structure to the semiconductor substrate.

In this manner, the metal oxide structure is formed by localized thermal oxidation of the layer of metal such that a deposition or sputtering process or an etching process is not necessary for formation of the metal oxide structure. In addition, the thickness of the metal oxide structure is determined by controlling the thickness of the layer of metal used for forming the metal oxide structure.

In another embodiment of the present invention, a layer of conductive material is deposited to fill the opening of the layer of oxygen blocking material. The layer of conductive material is deposited over the layer of oxygen blocking material. The layer of conductive material is polished down over the layer of oxygen blocking material until the layer of oxygen blocking material is exposed. The conductive material that is contained within the opening of the layer of oxygen blocking material and that is disposed over the metal oxide structure remains to form a gate structure of a field effect transistor, and the metal oxide structure forms a gate dielectric of the field effect transistor. Any exposed regions of the oxygen blocking material is etched away such that sidewalls of the gate structure of the conductive material are exposed. Also, any exposed regions of the layer of metal is etched away such that the sidewalls of the gate dielectric of the metal oxide structure are exposed.

The present invention may be used to particular advantage when the interfacial dopant is comprised of nitrogen ions, when the layer of oxygen blocking material is comprised of silicon nitride (SiN), and when the metal oxide structure is comprised of one of aluminum oxide ($Al_2O_3$), titanium oxide ($TiO_2$), tantalum oxide ($Ta_2O_5$), and zirconium oxide ($ZrO_2$) having a thickness in a range of from about 150 Å (angstroms) to about 200 Å (angstroms).

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

Figure 1:
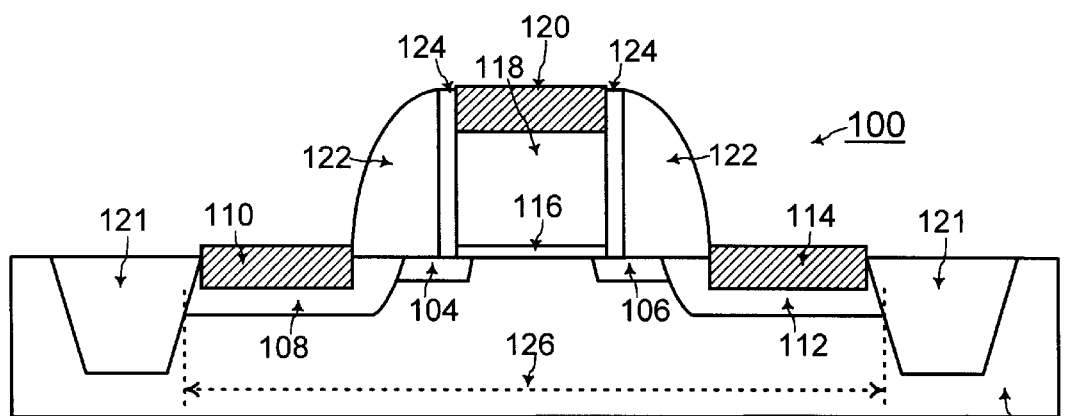
FIG. 1 shows a cross-sectional view of a conventional MOSFET (Metal Oxide Semiconductor Field Effect Transistor) having a gate electrode and a thin gate dielectric comprised of silicon dioxide ($SiO_2$)
Figure 2:
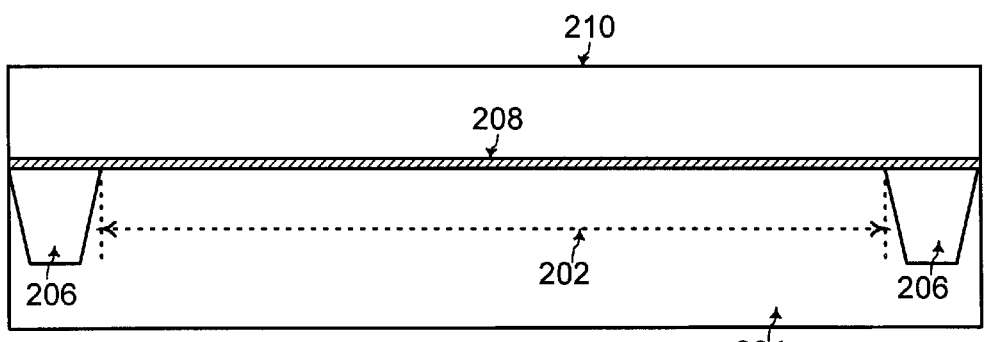
FIGS. 2, 3, 4, 5, 6, 7, 8, 9, 10, and 11 show cross-sectional views for illustrating the steps for fabricating a metal oxide structure having relatively high thickness for a gate dielectric of a field effect transistor using localized thermal oxidation of a layer of metal, to minimize tunneling current through the gate dielectric, according to an embodiment of the present invention.

In the cross-sectional view of FIG. 2, an active device area 202 is formed in a semiconductor substrate 204 by STI (shallow trench isolation) structures 206. The semiconductor substrate 204 may be comprised of silicon in one embodiment of the present invention. STI (shallow trench isolation) technology for electrical isolation of an active device area is known to one of ordinary skill in the art of integrated circuit fabrication.

Further referring to FIG. 2, for formation of a metal oxide structure, a layer of metal 208 is deposited on the semiconductor substrate 204. The layer of metal 208 contacts the active device area 202 of the semiconductor substrate 204. When the metal oxide structure to be formed is comprised of aluminum oxide ($Al_2O_3$), for example, the layer of metal 208 is comprised of aluminum. When the metal oxide structure to be formed is comprised of titanium dioxide ($TiO_2$), the layer of metal 208 is comprised of titanium. When the metal oxide structure to be formed is comprised of tantalum oxide ($Ta_2O_5$), the layer of metal 208 is comprised of tantalum. When the metal oxide structure to be formed is comprised of zirconium dioxide ($ZrO_2$), the layer of metal 208 is comprised of zirconium. In any case, the thickness of the layer of metal 208 is in a range of from about 100 Å (angstroms) to about 120 Å (angstroms). Processes for deposition of such a layer of metal are known to one of ordinary skill in the art of integrated circuit fabrication.

Further referring to FIG. 2, a layer of oxygen blocking material 210 is deposited on the layer of metal 208. The layer of oxygen blocking material 210 is comprised of a material such as silicon nitride (SiN) wherein oxygen does not easily diffuse. Processes for deposition of such an oxygen blocking material 210 are known to one of ordinary skill in the art of integrated circuit fabrication.

In one embodiment of the present invention, a silicon nitride deposition process is used to deposit a layer of silicon nitride having a thickness in a range of from about 1000 Å (angstroms) to about 2000 Å (angstroms) as the layer of oxygen blocking material 210 using a relatively low temperature in a range of from about 250° Celsius to about 300° Celsius. Such a relatively low temperature is amenable for preventing diffusion of shallow junctions already formed in other areas of the semiconductor substrate 204.

Figure 3:
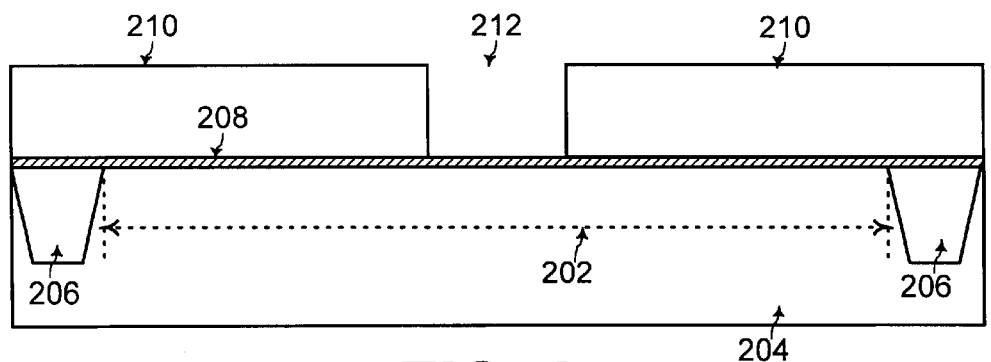

Referring to FIG. 3, an opening 212 is etched through the layer of oxygen blocking material 210 to expose an area of the layer of metal 208 located on top of the active device area 202 of the semiconductor substrate 204. When the metal oxide structure to be formed on top of the active device area 202 is to be used as a gate dielectric of a MOSFET (metal oxide semiconductor field effect transistor), the opening 212 is sized to the desired dimensions of the gate dielectric of such a MOSFET. Processes for patterning and etching the opening 212 through the layer of oxygen blocking material 210 that may be comprised of silicon nitride (SiN) are known to one of ordinary skill in the art of integrated circuit fabrication.

Figure 4:
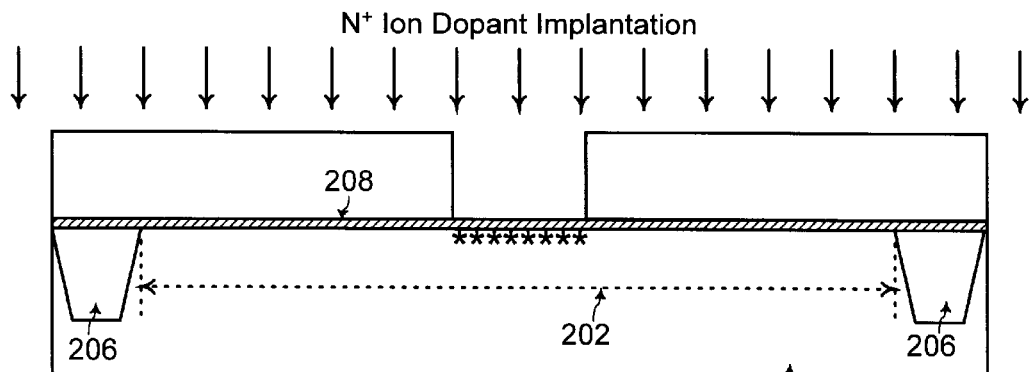

Referring to FIG. 4, an interfacial dopant is implanted through the layer of metal 208 to the semiconductor substrate 204 adjacent the layer of metal 208 in the area of the opening 212 where the layer of metal 208 is exposed (as shown by the character "*" in FIG. 4). The interfacial dopant in one embodiment of the present invention is nitrogen ($N^+$) ions. The presence of such interfacial dopant near the interface between the semiconductor substrate 204 and the layer of metal 208 promotes the interfacial adhesion quality of the metal oxide structure to be formed to the semiconductor substrate 204. Processes for implantation of the interfacial dopant such as nitrogen ions through the layer of metal 208 are known to one of ordinary skill in the art of integrated circuit fabrication.

Figure 5:
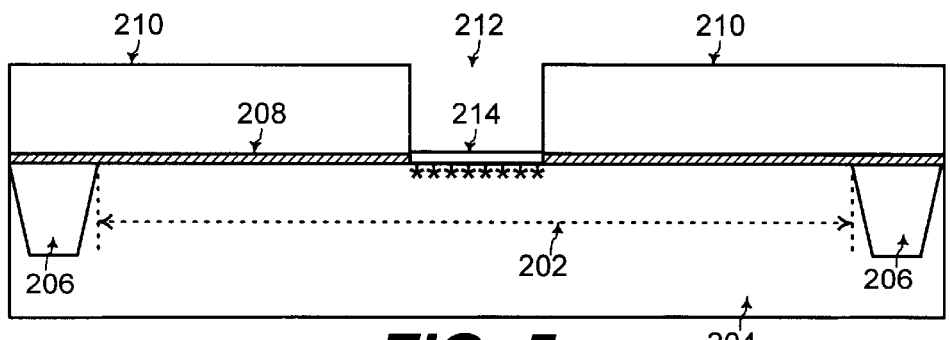

Referring to FIG. 5, a thermal oxidation process is performed by heating the semiconductor substrate 204 to a temperature in a range of from about 250° Celsius to about 700° Celsius and flowing oxygen gas to the semiconductor substrate 204. Systems for performing thermal oxidation processes are known to one of ordinary skill in the art of electronics. The relatively low temperature used during this thermal oxidation process is amenable for preventing diffusion of shallow junctions already formed in other areas of the semiconductor substrate 204.

During this thermal oxidation process of FIG. 5, a metal oxide structure 214 is formed from a reaction of oxygen with the area of the layer of metal 208 exposed through the opening 212. The thickness of the metal oxide structure 214 formed in this thermal oxidation process is determined by the thickness of the layer of metal 208. For example, when the metal oxide structure 214 is to be used as a gate dielectric of a MOSFET (metal oxide semiconductor field effect transistor) having scaled down dimensions of tens of nanometers, the metal oxide structure 214 has a thickness in a range of from about 150 Å (angstroms) to about 200 Å (angstroms) when the metal oxide structure 214 is comprised of aluminum oxide ($Al_2O_3$), titanium dioxide ($TiO_2$), tantalum oxide ($Ta_2O_5$), and zirconium dioxide ($ZrO_2$). In that case, the thickness of the layer of metal 208 which is comprised of aluminum, titanium, tantalum, or zirconium is controlled to be in a range of from about 100 Å (angstroms) to about 120 Å (angstroms), according to one embodiment of the present invention. Processes for controlling the thickness of the layer of metal 208 are known to one of ordinary skill in the art of integrated circuit fabrication.

Further referring to FIG. 5, during this thermal oxidation process for forming the metal oxide structure 214, the presence of the interfacial dopant near the interface between the semiconductor substrate 204 and the layer of metal 208 promotes the interfacial adhesion of the metal oxide structure 214 to the semiconductor substrate 204. In addition, during the thermal oxidation process for forming the metal oxide structure 214, the layer of oxygen blocking material 210 prevents contact of oxygen with the layer of metal 208.

Thus, the metal oxide structure 214 is formed localized at the area of the layer of metal 208 that is exposed through the opening 212.

Figure 6:
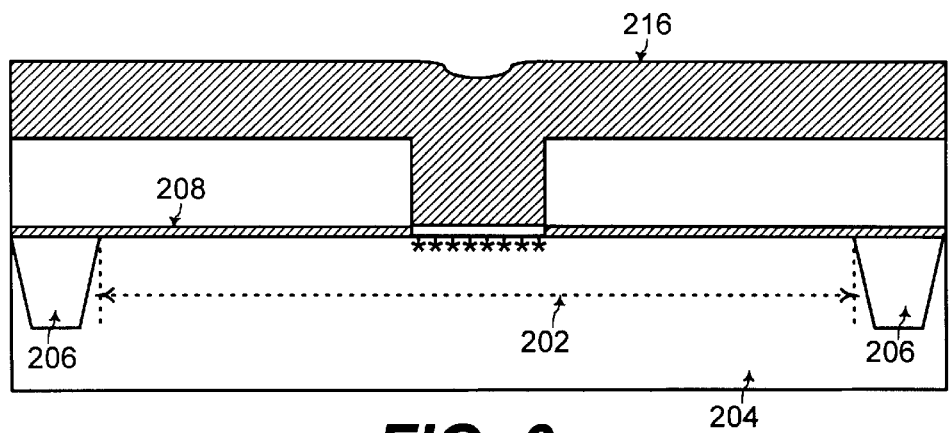

Referring to FIG. 6, a layer of conductive material 216 is conformally deposited to fill the opening 212 of the layer of oxygen blocking material 210 and over the layer of oxygen blocking material 210. The layer of conductive material 216 may be comprised of poly-silicon germanium (SiGe) with the germanium content being in a range of from about 20 atomic percent to about 50 atomic percent. Alternatively, the conductive material 216 is comprised of a refectory metal having a melting temperature that is higher than about 1300° Celsius such as tungsten, titanium, or molybdenum for example. The thickness of the layer of conductive material 216 is in a range of from about 3000 Å (angstroms) to about 4000 Å (angstroms). Processes for conformally depositing such a layer of conductive material 216 are known to one of ordinary skill in the art of integrated circuit fabrication.

Figure 7:
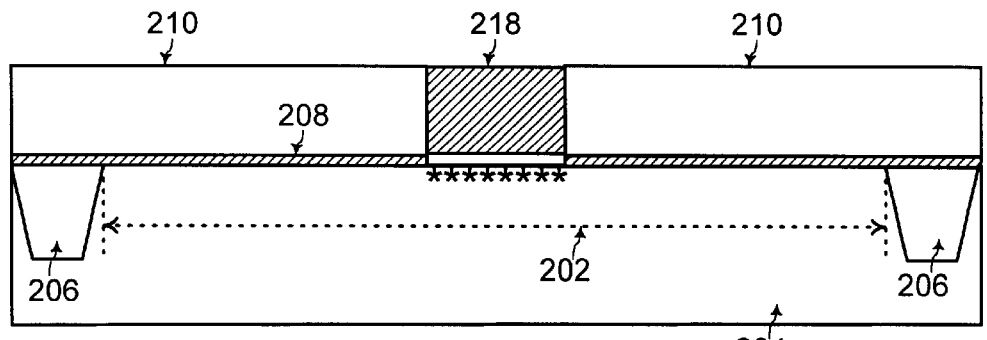

Referring to FIG. 7, the layer of conductive material 216 over the layer of oxygen blocking material 210 is polished down until the layer of oxygen blocking material 210 is exposed such that the conductive material 216 is contained within the opening 212 of the layer of oxygen blocking material 210 to form a gate structure 218 of a field effect transistor. The gate structure 218 is disposed over the metal oxide structure 214 that forms a gate dielectric of the field effect transistor. Processes such as CMP (chemical mechanical polishing) processes for polishing the conductive material 216 with the layer of oxygen blocking material 210 being used as a polish stop are known to one of ordinary skill in the art of integrated circuit fabrication.

Figure 8:
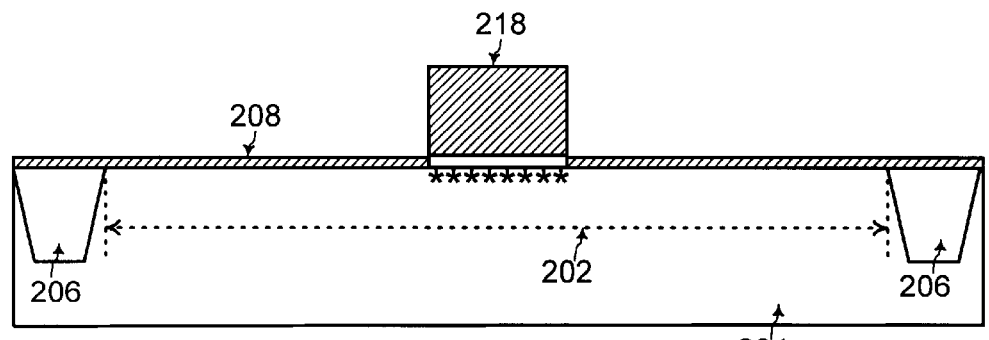
Figure 9:
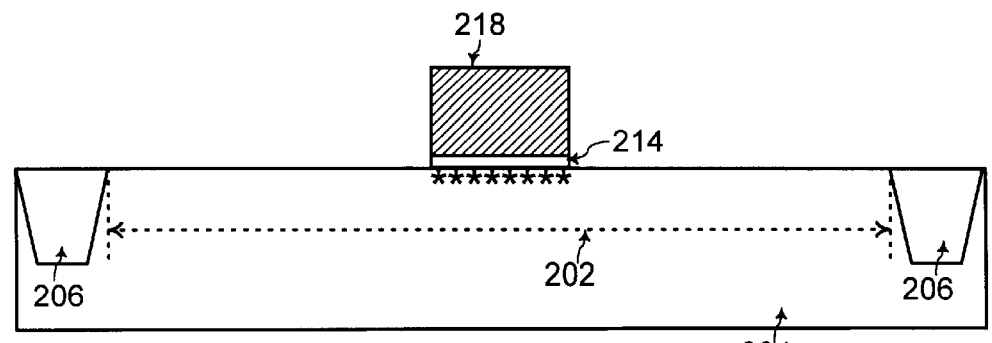

Referring to FIG. 8, any exposed regions of the layer of oxygen blocking material 210 are etched away such that sidewalls of the gate structure 218 of the conductive material are exposed. Processes such as a wet chemical etch using hot phosphoric acid ($H_3PO_4$) for etching away the layer of oxygen blocking material 210 which may be comprised of silicon nitride (SiN) are known to one of ordinary skill in the art of integrated circuit fabrication. Referring to FIG. 9, any exposed regions of the layer of metal 208 are etched away such that the sidewalls of the gate dielectric of the metal oxide structure 214 are exposed. Processes for etching away the layer of metal 208 are known to one of ordinary skill in the art of integrated circuit fabrication.

Figure 10:
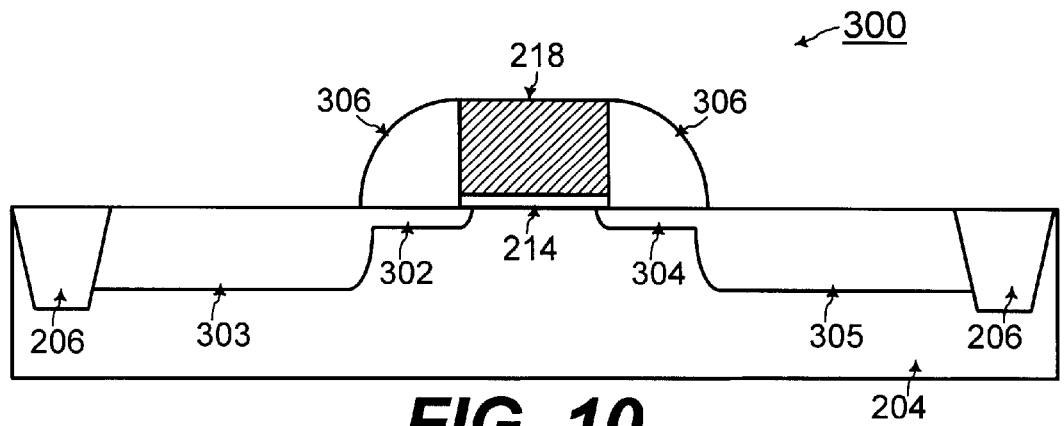

Referring to FIG. 10, other structures of a MOSFET (metal oxide semiconductor field effect transistor) 300 are fabricated to surround the gate dielectric of the metal oxide structure 214 and the gate structure 218. A drain extension 302 with a drain contact junction 303 and a source extension 304 with a source contact junction 305 are formed. The drain extension 302 and the source extension 304 are shallow junctions to minimize short-channel effects in the MOSFET 300 having submicron or nanometer dimensions, as known to one of ordinary skill in the art of integrated circuit fabrication. The drain contact junction 303 and the source contact junction 305 are fabricated as deeper junctions such that a relatively large size of a drain silicide and a source silicide respectively may be fabricated therein to provide low resistance contact to the drain and the source respectively of the MOSFET 300. Spacers 306 surround the sidewalls of the gate structure 218 and the metal oxide structure 214. The spacer 306 is comprised of an electrically insulating material such as silicon dioxide ($SiO_2$) for example to electrically isolate the gate structure 218 and the metal oxide structure 214.

Figure 11:
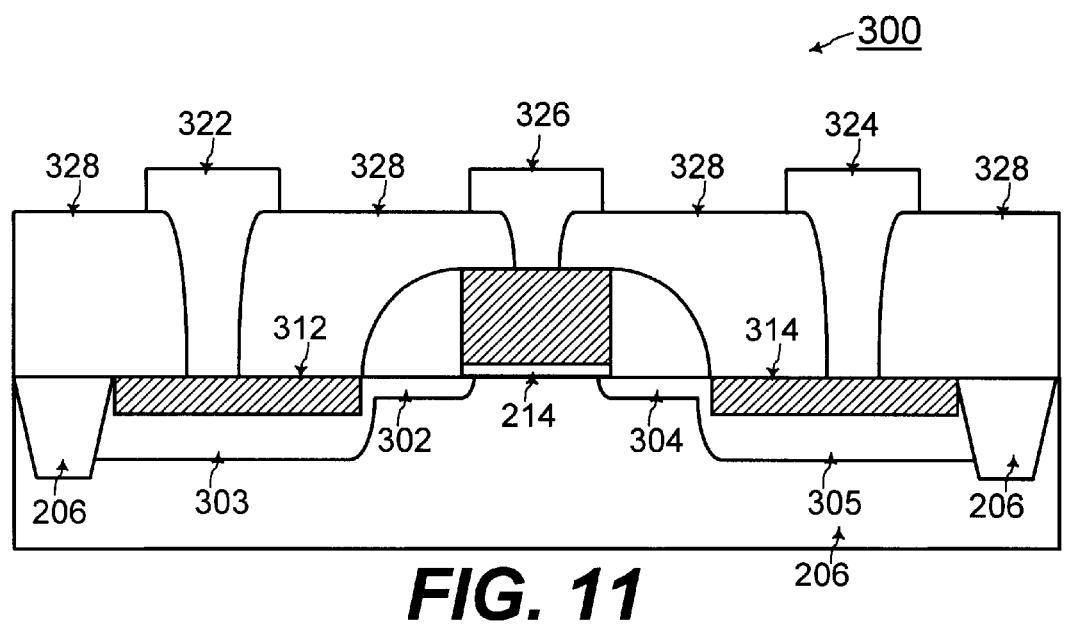

Referring to FIG. 11, a drain silicide 312 is formed with the drain contact junction 303 for providing contact to the drain of the MOSFET 300, and a source silicide 314 is formed with the source contact junction 305 for providing contact to the source of the MOSFET 300. Such silicides may be comprised of one of cobalt silicide ($CoSi_2$) or titanium silicide ($TiSi_2$) for example, and processes for formation of such silicides are known to one of ordinary skill in the art of integrated circuit fabrication.

Further referring to FIG. 11, conventional fabrication processes may follow for forming contacts and interconnects to the MOSFET 300 such as a drain contact 322 to provide connection to the drain silicide 312, a source contact 324 to provide connection to the source silicide 314, and a gate contact 326 to provide connection to the gate structure 218. Field oxides 328 may also be deposited for electrical isolation of the components of the MOSFET 300.

In this manner, with higher thickness of a gate dielectric of a MOSFET when the gate dielectric is comprised of a metal oxide, charger carrier tunneling through the gate dielectric is reduced such that static power dissipation through the gate of the MOSFET is reduced for MOSFETs having scaled down dimensions of tens of nanometers. In addition, with minimized charger carrier tunneling through the gate dielectric, charge carrier accumulation in the channel of the MOSFET is not minimized such that resistance through the channel of MOSFET is not increased. Minimized resistance through the channel of the MOSFET enhances the speed performance of the MOSFET. In addition, referring to FIGS. 4 and 5, with implantation of the interfacial dopant such as nitrogen ions in the semiconductor substrate 204 near the layer of metal 208, the metal oxide structure 214 has a strong adhesion to the semiconductor substrate 204 for enhanced reliability of the MOSFET 300.

With the described embodiment of the present invention, a metal oxide structure is formed by localized thermal oxidation of a layer of metal such that a deposition or sputtering process or an etching process is not necessary for formation of the metal oxide structure. In addition, the thickness of the metal oxide structure is determined by controlling the thickness of the layer of metal used for forming the metal oxide structure.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a metal oxide structure on a semiconductor substrate, the method including the steps of:
    A. forming an active device area surrounded by at least one STI (shallow trench isolation) structure in said semiconductor substrate;
    B. depositing a layer of metal on said semiconductor substrate, wherein said layer of metal contacts said active device area of said semiconductor substrate;
    C. depositing a layer of oxygen blocking material on said layer of metal;
    D. etching an opening through said layer of oxygen blocking material to expose an area of said layer of metal on top of said active device area;
    E. implanting an interfacial dopant through said layer of metal to said semiconductor substrate adjacent said layer of metal in said area of said opening where said layer of metal is exposed; and
    F. performing a thermal oxidation process to form a metal oxide structure from reaction of oxygen with said area of said opening where said layer of metal is exposed, wherein a thickness of said metal oxide structure is determined by a thickness of said layer of metal, and wherein said layer of oxygen blocking material prevents contact of oxygen with said layer of metal such that said metal oxide structure is formed localized at said area of said opening where said layer of metal is exposed;
    and wherein said interfacial dopant implanted into said semiconductor substrate adjacent said layer of metal in said step E promotes adhesion of said metal oxide structure to said semiconductor substrate.

2. The method of claim 1, further including the steps of:
    G. depositing a layer of conductive material to fill said opening of said layer of oxygen blocking material, and wherein said layer of conductive material is deposited over said layer of oxygen blocking material;
    H. polishing down said layer of conductive material over said layer of oxygen blocking material until said layer of oxygen blocking material is exposed such that said conductive material that is contained within said opening of said layer of oxygen blocking material and that is disposed over said metal oxide structure remains to form a gate structure of a field effect transistor, and wherein said metal oxide structure forms a gate dielectric of said field effect transistor; and
    I. etching away any exposed regions of said oxygen blocking material such that sidewalls of said gate structure of said conductive material are exposed.

3. The method of claim 2, further including the steps of:
    J. etching away any exposed regions of said layer of metal such that said sidewalls of said gate dielectric of said metal oxide structure are exposed.

4. The method of claim 2, wherein said conductive material is comprised of poly-silicon-germanium with a germanium content in a range of from about 20 atomic percent to about 50 atomic percent.

5. The method of claim 2, wherein said conductive material is comprised of a refractory metal having a melting temperature that is higher than about 1300° Celsius.

6. The method of claim 5, wherein said conductive material is comprised of one of tungsten, titanium, and molybdenum.

7. The method of claim 1, wherein said layer of metal is comprised of one of aluminum, titanium, tantalum, and zirconium.

8. The method of claim 7, wherein the thickness of said layer of metal is in a range of from about 100 Å (angstroms) to about 120 Å (angstroms).

9. The method of claim 8, wherein said metal oxide structure is comprised of one of aluminum oxide ($Al_2O_3$), titanium oxide ($TiO_2$), tantalum oxide ($Ta_2O_5$), and zirconium oxide ($ZrO_2$) having a thickness in a range of from about 150 Å (angstroms) to about 200 Å (angstroms).

10. The method of claim 1, wherein said interfacial dopant implanted into said semiconductor substrate adjacent said layer of metal in said step E is nitrogen ions.

11. The method of claim 1, wherein said layer of oxygen blocking material is comprised of silicon nitride (SiN).

12. The method of claim 1, wherein said thermal oxidation process is performed with a temperature in a range of from about 250° Celsius to about 700° Celsius.

13. A method for fabricating a metal oxide structure for a gate dielectric of a field effect transistor on a semiconductor substrate, the method including the steps of:

A. forming an active device area surrounded by at least one STI (shallow trench isolation) structure in said semiconductor substrate;

B. depositing a layer of metal on said semiconductor substrate, wherein said layer of metal contacts said active device area of said semiconductor substrate, and wherein said layer of metal is comprised of one of aluminum, titanium, tantalum, and zirconium having a thickness in a range of from about 100 Å (angstroms) to about 120 Å (angstroms);

C. depositing a layer of oxygen blocking material of silicon nitride on said layer of metal;

D. etching an opening through said layer of oxygen blocking material to expose an area of said layer of metal on top of said active device area;

E. implanting an interfacial dopant of nitrogen ions through said layer of metal to said semiconductor substrate adjacent said layer of metal in said area of said opening where said layer of metal is exposed;

F. performing a thermal oxidation process with a temperature in a range of from about 250° Celsius to about 700° Celsius to form a metal oxide structure from reaction of oxygen with said area of said opening where said layer of metal is exposed, wherein a thickness of said metal oxide structure is determined by a thickness of said layer of metal, and wherein said layer of oxygen blocking material prevents contact of oxygen with said layer of metal such that said metal oxide structure is formed localized at said area of said opening where said layer of metal is exposed;

and wherein said metal oxide structure is comprised of one of aluminum oxide ($Al_2O_3$), titanium oxide ($TiO_2$), tantalum oxide ($Ta_2O_5$), and zirconium oxide ($ZrO_2$) having a thickness in a range of from about 150 Å (angstroms) to about 200 Å (angstroms);

and wherein said interfacial dopant implanted into said semiconductor substrate adjacent said layer of metal in said step E promotes adhesion of said metal oxide structure to said semiconductor substrate;

G. depositing a layer of conductive material to fill said opening of said layer of oxygen blocking material, and wherein said layer of conductive material is deposited over said layer of oxygen blocking material, wherein said conductive material is comprised of one of polysilicon-germanium with a germanium content in a range of from about 20 atomic percent to about 50 atomic percent, tungsten, titanium, and molybdenum;

H. polishing down said layer of conductive material over said layer of oxygen blocking material until said layer of oxygen blocking material is exposed such that said conductive material that is contained within said opening of said layer of oxygen blocking material and that is disposed over said metal oxide structure remains to form said gate structure of said field effect transistor, and wherein said metal oxide structure forms a gate dielectric of said field effect transistor;

I. etching away any exposed regions of said oxygen blocking material such that sidewalls of said gate structure of said conductive material are exposed; and J. etching away any exposed regions of said layer of metal such that said sidewalls of said gate dielectric of said metal oxide structure are exposed.

* * * * *